United States Patent [19]
Abe et al.

[11] Patent Number: 5,319,320
[45] Date of Patent: Jun. 7, 1994

[54] PHASE-LOCKED LOOP HAVING FREQUENCY AND PHASE CONTROL CURRENT PUMPS

[75] Inventors: Akira Abe; Takeshi Kawasaki, both of Suwa, Japan

[73] Assignee: Seiko Epson Corporation, Tokyo, Japan

[21] Appl. No.: 30,470

[22] PCT Filed: Jul. 20, 1992

[86] PCT No.: PCT/JP92/00932
§ 371 Date: May 28, 1993
§ 102(e) Date: May 28, 1993

[87] PCT Pub. No.: WO93/03545
PCT Pub. Date: Feb. 18, 1993

[30] Foreign Application Priority Data
Aug. 6, 1991 [JP] Japan .................... 3-196732

[51] Int. Cl.⁵ .................... H03L 7/089; H03L 7/093
[52] U.S. Cl. .................... 331/1 A; 331/8; 331/14; 331/17; 331/25
[58] Field of Search .................... 331/1 A, 8, 14, 17, 331/25

[56] References Cited

U.S. PATENT DOCUMENTS

| | | | |
|---|---|---|---|
| 4,167,711 | 9/1979 | Smoot | 331/8 X |
| 4,885,552 | 12/1989 | Boudewijns | 331/1 A |
| 5,021,749 | 6/1991 | Kasai et al. | 331/17 |

FOREIGN PATENT DOCUMENTS

| | | |
|---|---|---|
| 51-26452 | 3/1976 | Japan . |
| 53-94755 | 8/1978 | Japan . |
| 58-27438 | 2/1983 | Japan . |
| 62-92521 | 4/1987 | Japan . |
| 2-67008 | 3/1990 | Japan . |

Primary Examiner—Siegfried H. Grimm
Attorney, Agent, or Firm—W. Douglas Carothers, Jr.

[57] ABSTRACT

The frequency control and phase control of a voltage-controlled oscillator (50) of a phase-locked loop (100) comprise two current paths. The frequency control system comprises a filter (75) that converts pulse output current ($i_1$) of a charge pump (70) generated by phase error signals ($X_1$, $X_2$) to a DC voltage, and a resistor ($R_1$ or $R_2$) that converts that voltage to DC current ($i_3$), and the phase control system comprises a charge pump (80) that generates a pulse output current ($i_2$) using the phase error signals ($X_1$, $X_2$). The frequency and phase of the oscillator output ($V_{OUT}$) of the voltage-controlled oscillator (50) is controlled by a composite current $i_4$, which is the sum of the DC current ($i_3$) and the output current $i_2$. Since it is possible to make the natural angular frequency proportional to the data transfer rate while the damping factor remains unchanged, by changing the value of the currents ($i_3$, $i_2$) through the switching of switches ($SW_1$, $SW_2$) when the data transfer rate of the input signal ($S_{IN}$) changes, a phase-locking characteristic can be realized that accommodates a wide range of data transfer rates.

14 Claims, 5 Drawing Sheets

PHASE-LOCKED LOOP HAVING FREQUENCY AND PHASE CONTROL CURRENT PUMPS

BACKGROUND OF THE INVENTION

The invention generally relates to phase-locked loops that generate a clock synchronized in phase with an input signal and more particularly to improving phase-locked loops applicable to zone bit recording in hard disk systems, etc.

As shown in FIG. 4, prior art configurations widely used for phase-locked loops in data separators and frequency multiplier circuits for magnetic disk devices, etc., comprise, a phase comparator 10 which compares the phases of an input signal $S_{IN}$, a reference signal, and an oscillator output $V_{OUT}$ (at oscillation frequency $f_{OSC}$) of a voltage-controlled oscillator 40, and outputs first and second phase difference detection signals $X_1$ and $X_2$. A charge pump 20 supplies a charge/discharge current i (pulse output current) to a loop filter 30 capacitor $C_F$ which is based on the first and second phase difference detection signals $X_1$ and $X_2$. Loop filter 30 is a low pass filter (LPF) which is configured as a series circuit including resistor $R_F$ and capacitor $C_F$, and voltage-controlled oscillator (VCO) 40 which generates oscillator output $V_{OUT}$ at oscillation frequency $f_{OSC}$, which corresponds to a value for analog filter output voltage $V_F$, which is used as a control input.

Voltage-controlled oscillator 40 generally comprises a voltage-current conversion circuit, which converts the control input voltage into a current, and a current-frequency conversion circuit which changes the frequency $f_{OSC}$ of oscillator output $V_{OUT}$, according to the resulting output current. Oscillation frequency $f_{OSC}$ of voltage-controlled oscillator 40 may be input into phase comparator 10 using a prescribed divider. Phase comparator 10 is a digital phase comparator; e.g., configured from a pair of D-type flip-flops and a logic gate. Charge pump 20, as shown in FIG. 5, is a series circuit configured from a switching transistor 22 (p-type MOSFET) used for source current switching, which turns ON when first phase difference detection signal $X_1$ is at a low level, a constant current source 24 used to generate source current; a switching transistor 26 (n-type MOSFET) used for sink current switching, which turns ON when second phase difference detection signal $X_2$ is at a high level, and a constant current source 28 used to generate sink current.

When a phase difference occurs in oscillator output $V_{OUT}$ with respect to input signal $S_{IN}$ in a phase-locked loop having the above configuration, phase comparator 10 generates phase difference detection signals $X_1$, $X_2$. Charge pump 20 outputs source or sink current i using signals $X_1$, $X_2$, as shown in FIG. 6. Therefore, a voltage drop is generated across resistor $R_F$ of filter 30 and capacitor $C_F$ is charged and discharged by this pulse current. Since oscillation frequency $f_{OSC}$ of voltage-controlled oscillator 40 is varied by the value of the filter output voltage $V_F$, the phase difference between oscillator output $V_{OUT}$ and input signal $S_{IN}$ becomes zero as time progresses.

During a time in which signals $X_1$, $X_2$ of each period are not generated, an integrated load is stored in capacitor $C_F$, and, therefore, the output of voltage-controlled oscillator 40 is controlled by that charging voltage. Therefore, the charging voltage of capacitor $C_F$ for current i functions as a frequency control signal for the pull-in operation that matches oscillation frequency $f_{OSC}$ to the frequency of input signal $S_{IN}$. The voltage drop in resistor $R_F$ for current i functions as a phase control signal for the lock-in operation since it controls the output phase of voltage-controlled oscillator 40, when error signals $X_1$, $X_2$ are generated.

Since this kind of phase-locked loop performs phase locking with respect to a specific input signal $S_{IN}$ which fluctuates within a narrow frequency range, the value of the electrical element of each circuit is optimized. These include, for example, the value of output current i of charge pump 20, the time constant of loop filter 30, and the conversion factor for the output frequency of the voltage-controlled oscillator 40 with respect to the input voltage. Therefore, in zone bit recording in a hard disk system, input signal $S_{IN}$ is generated, for example, at data transfer rates of four zones ($f_1=8$ MHz, $f_2=10$ MHz, $f_3=12$ MHz, $f_4=14$ MHz) in which the data transfer rate is switched, but since the frequency component for jitter also changes, it is necessary to perform an adjustment that optimizes the values of the above circuit elements at the points of change. More specifically, it is necessary to provide a plurality of loop filters with differing time constants, and to switch and connect to the optimum loop filter in synchronization with the switching of the frequency of the input signal.

The two equations below are important equations for describing the basic characteristics (phase difference characteristics) of a phase-locked loop that uses loop filter 30 as shown in FIG. 5.

$$\omega_n = \sqrt{K_v \cdot K_c / C} \tag{1}$$

$$z = CR\omega_n/2 \tag{2}$$

Here, $w_n$ is the natural angular frequency, z is the damping factor, $K_v$ is voltage frequency conversion factor of voltage-controlled oscillator 40, $K_c$ is the phase comparator conversion factor that matches phase comparator 10 and charge pump 20, C is the electrostatic capacitance of capacitor $C_F$ of loop filter 30, and R is the resistance value of resistor $R_F$ of loop filter 30. Natural angular frequency $w_n$ must change in proportion to the frequency for quick lock-in when the frequency (data transfer rate) of input signal $S_{IN}$ is high, but it is generally necessary to make damping factor z a constant value (e.g., $2^{-\frac{1}{2}} \approx 0.7$). This is important from the standpoint of the phase step response and peak shift margin characteristics of the phase-locked loop. Because of its circuit configuration, voltage-controlled oscillator 40 has fixed voltage frequency conversion factor $K_v$, and, therefore, cannot be easily changed from outside the circuit. Therefore, when the data transfer rate is changed, $w_n$ can be made proportional to the data transfer rate while z remains constant by making $K_c$ proportional to the data transfer rate, making C inversely proportional to the data transfer rate and making R constant. Here, $K_c$ is generally displayed in radians and is given by i/2p. Therefore, if output current i is made proportional to the data transfer rate by switching the internal circuit, factor $K_c$ becomes proportional to the data transfer rate, and, therefore, current sources 24 and 28 must be configured as variable current sources.

However, the phase-locked loop described above which uses a filter comprising a resistor and a capacitor presents the following problems.

(1) When the data transfer rate is fast, output current i of charge pump 10 must be made large, the value of capacitor $C_F$ of filter 30 must be made small. By comparison, when the data transfer rate is slow, the voltage drop of resistor $R_F$ and the charge voltage of capacitor $C_F$ become extremely large when output current i is generated. For this reason, the dynamic range is narrow because output voltage $V_F$ of filter 30 is readily clipped by the power source voltage. Therefore, the higher the data transfer rate, the narrower the pull-in range.

(2) When the above phase-locked loop is configured as an integrated circuit (IC) chip, the following problems are encountered. That is, plural loop filters configured as series circuits of C and R must be attached externally to the IC chip, and selection of an optimum loop filter synchronized with the switching of the data transfer rate. But when output current i is supplied to external loop filter 30 from charge pump 20 built into the IC chip, the value of output current i must be large.

This is because a requisite parasitic capacitance is generated in the wiring path from the charge pump inside the IC to the external loop filter (output cell, bonding wire, lead frame, etc.) or in the opposite wiring path from the loop filter to the voltage-controlled oscillator 40 inside the IC. Therefore, charge pump 20 must generate a somewhat large output current in consideration of the amount of charge consumed by the parasitic capacitance. This output current must be made larger as its frequency range increases more than the low frequency range. This is because as the data transfer rate changes to a higher frequency range, the pulse duration of phase difference detection signals $X_1$, $X_2$ becomes shorter and the drive time of charge pump 20 becomes smaller; e.g., in the case of a 50 MHz input signal $S_{IN}$, the drive time drops to less than 20 ns. Therefore, it is necessary to set the output current to a value with a larger margin in anticipation of the charge consumed by the parasitic capacitance. In order for the charge pump to generate this kind of large output current, it is necessary to use large MOS transistors to form current sources 24, 28 and to use large (gate width) switching transistors 22, 26 so that their ON resistance is small and current capacity is large.

This increased transistor size naturally promotes increased parasitic capacitance between the gate and the drain, and the so-called feed through effect of the gate signal extending to the output terminal becomes larger, resulting in waveform distortion due to disturbance of the rectangular waveform of the loop filter drive current. Also, since there is an increase in the gate capacitance accompanying the increased gate area, which is a natural result of the increased transistor size, a gate signal with a pulse duration of several nanoseconds is consumed by the gate capacitance, thus making the ON/OFF operation of the transistor difficult when a gate signal is impressed. When a switching speed of several nanoseconds becomes impossible, the resolution of phase locking becomes irregular. In other words, phase locking is poor within the high frequency range. Further, though a pulse type output current i is supplied to the external loop filter, the pulse type output current itself contains a considerable high frequency component, and, therefore, as the pulse duration becomes shorter, a wiring inductance component manifests itself, which greatly disturbs the output current waveform and tends to destabilize the input voltage of voltage-controlled oscillator 40, resulting in poor phase locking stability.

The invention solves the above problems. First, it offers a phase-locked loop capable of making the phase difference between the input signal and the output signal zero even when the frequency of the input signal, which is the reference signal, changes discretely or continuously. Secondly, it offers a phase-locked loop with a wide pull-in range even in phase-locking operations for input signals of any frequency. Thirdly, it offers a phase-locked loop with superior phase locking resolution, and phase locking in high frequency ranges while also having good phase-locking stability.

SUMMARY OF THE INVENTION

In order to solve the above problems, the apparatus constructed according to the invention generates a frequency control signal and phase control signal of prior art phase-locked loops using independent control systems. That is, the inventive phase-locking apparatus is configured using separate systems: a frequency control means that generates frequency control current by receiving a phase error signal from a phase comparison means and converting it to a DC component, and a phase control means that receives the phase error signal and generates a phase control current pulse equal to the phase error time and phase error polarity, and it controls an oscillation means by adding the frequency control current and phase control current pulse.

More specifically, the frequency control means is configured, for example, from a first charge pump which generates an output current with a value corresponding to the frequency of the input signal and a polarity corresponding to the phase error polarity, a filter means made with a capacitor that uses the output current as a charge/discharge current, a voltage buffer means which receives the output voltage of the filter, and a voltage-current conversion means that converts the output voltage of the voltage buffer means to a frequency control current. A resistor, for example, can be used as this current-voltage conversion means. Differing resistance values can be selected for the resistor depending on the value of the frequency of the input signal, and several resistors external to the IC chip can be used. The first charge pump means can also be configured, for example, using a variable current source for current output and a variable current source for current pull-in whose current values change according to the value of the frequency of the input signal. The phase control means can be specifically configured, for example, using a second charge pump means that generates the above phase control current pulse with a value corresponding to the frequency of the input signal and a polarity corresponding to the phase error polarity. Similarly, the second charge pump means may be specifically configured using a variable current source for current output and a variable current source for current pull-in whose current values change according to the value of the frequency of the input signal. The filter means is configured using only a capacitor, but it is not limited to a single capacitor and may be configured using several capacitors connected in series between the power source voltage.

When a phase error signal is generated by the phase comparison means in this configuration, the frequency control means of the frequency control system generates a frequency control current for the DC component. The phase control means of the separate phase control system also generates a phase control current pulse. The frequency control current and phase control current pulse are superposed and added, and the oscillation output of the oscillation means is controlled by this composite current. When the data transfer rate changes, the damping factor stays constant while the values of the frequency control current and phase control current pulse are adjusted so that the natural angular frequency is proportional to that rate, whereby phase locking can be realized that accommodates any data transfer rate. Also, since the frequency control system and the phase control system are configured as separate systems, there is no clipping of the signal by the power source voltage, and even if the data transfer rate becomes fast, there is no sudden narrowing of the pull-in range and the pull-in range can be broadened. In order to produce the frequency control current, a configuration is employed that includes a filter means, but the filter means used in the invention need not be a prior art series circuit made from a resistor and a capacitor, and it can use a configuration that excludes the resistor and only includes a capacitor. This is because the amount of phase control equivalent to the amount of voltage drop due to the resistance can be achieved in the phase control system. As a result, when the phase-locked loop is integrated into an IC chip, only the resistor or other voltage-current conversion means that converts the output voltage of the filter means to current needs be connected to the chip externally, and the other electronic elements can be integrated into the IC chip. Of course, a single filter means comprising only a capacitor can be built into the IC chip. Here, the phase control system generates the pulse current for phase control, but since the phase control system is also integrated into the semiconductor chip, the pulse current containing a considerable high frequency component is not readily affected by parasitic capacitance.

Therefore, phase-locking characteristics can be improved by improving the resolution. Since the wiring length can be shortened, a stable oscillation frequency can also be achieved without being affected by wiring inductance. Since the filter means is not connected externally, a large parasitic capacitance does not appear, and the current source transistor or switching transistor that drives it need not be large. Therefore, since waveform distortion can be suppressed by lowering the feedthrough effect, phase-locking characteristics can also be improved in this regard.

DESCRIPTION OF THE PREFERRED EMBODIMENTS

Figure 1:
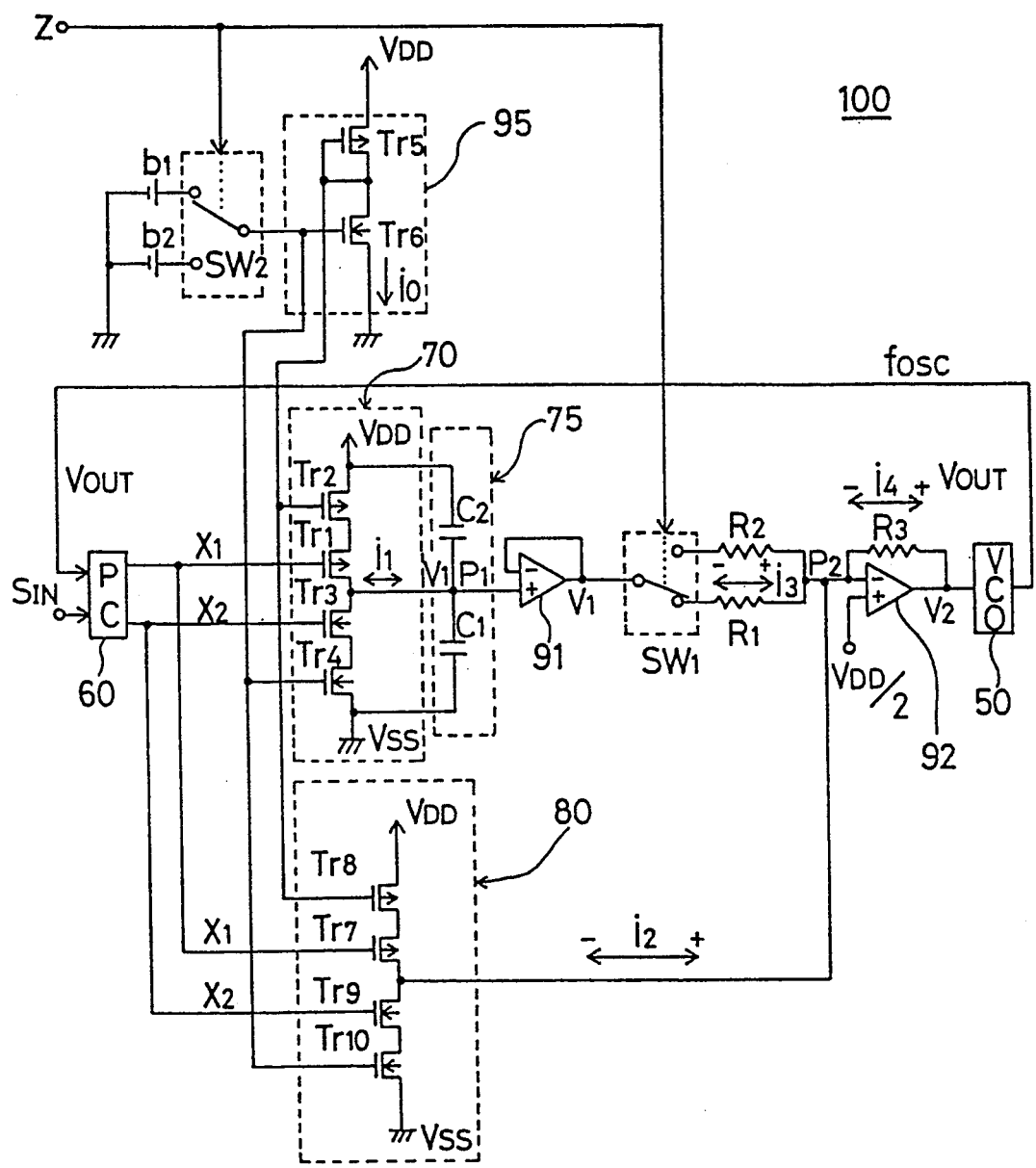
FIG. 1 is a circuit diagram of one embodiment of a phase-locked loop according to the invention.

FIG. 1 is circuit diagram of one embodiment of a phase-locked loop according to the invention. A phase-locked loop 100 comprises a digital phase comparator (PC) 60 which compares the phase of an input signal $S_{IN}$, as a reference signal, with the phase of an output $V_{OUT}$ (at oscillation frequency $f_{OSC}$) of a voltage-controlled oscillator 50, and outputs first and second phase difference detection signals $X_1$ and $X_2$. A first charge pump 70 supplies pulse charge/discharge current $i_1$ (output current) for a period of time corresponding to the phase difference between input signal $S_{IN}$ and oscillator output $V_{OUT}$ signals based on first phase difference detection signal $X_1$ and second phase difference detection signal $X_2$. A second charge pump 80 supplies pulse output current $i_2$ for a period of time corresponding to the phase difference between input signal $S_{IN}$ and oscillation output $V_{OUT}$ based on first phase difference detection signal $X_1$ and second phase difference detection signal $X_2$. A filter 75, made from capacitors $C_1$ and $C_2$, is charged and discharged by output current $i_1$ of first charge pump 70, while a high input impedance voltage follower buffer circuit 91 extracts voltage $V_1$ at a series connection point $P_1$ of capacitors $C_1$ and $C_2$, and resistors $R_1$, $R_2$, for voltage-current conversion, convert buffer output voltage $V_1$ to a corresponding current $i_3$. A selector switch $SW_1$ selects the buffer output terminal and one of resistors $R_1$, $R_2$ based on a zone switching signal Z. Phase-locked loop 100 is also equipped with inverted operational amplifier 92 for current-voltage conversion which adds current $i_3$ and output current $i_2$ from the second charge pump at point $P_2$, and converts the added current ($i_2+i_3$) into voltage $V_2$, along with a feedback resistor $R_3$. Voltage-controlled oscillator (VCO) 50 then uses output voltage $V_2$ of operational amplifier 92 as a control input and converts it to oscillation output $V_{OUT}$ at oscillation frequency $f_{OSC}$ according to its value. Phase-locked loop 100 also has a switch $SW_2$ for switching gate voltage, by selecting differing bias voltages $b_1$, $b_2$ based on zone switching signal Z, and a variable-current control circuit 95 for variably adjusting output currents $i_1$, $i_2$ of first and second charge pumps 70, 80.

Figure 2:
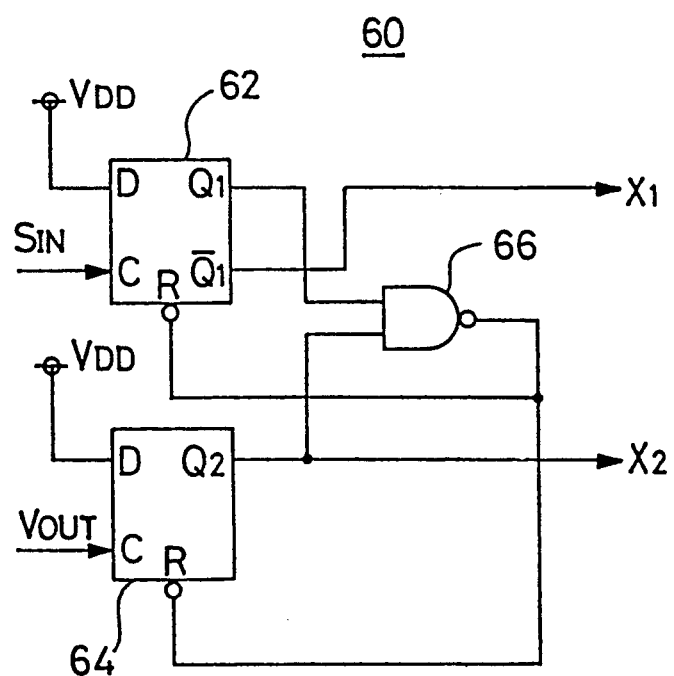
FIG. 2 is a circuit diagram of a phase comparator circuit for use in the embodiment of FIG. 1.

Phase comparator 60 is configured as shown in FIG. 2, for example, from D flip-flop 62 which uses input signal $S_{IN}$ as a clock input C and outputs phase difference detection signal $X_1$ from inverted output $\overline{Q}_1$; D flip-flop 64 which uses oscillation output $V_{OUT}$ of voltage-controlled oscillator 50 as clock input C, and outputs second phase difference detection signal $X_2$ from output $Q_2$; and NAND gate 66 which outputs a reset signal to D flip-flops 62, 64 using output $Q_1$ of D flip-flop 62 and second phase difference detection signal $X_2$ as its two inputs. If the phase of oscillation output $V_{OUT}$ is delayed in comparison to the phase of input signal $S_{IN}$, first phase difference detection signal $X_1$ becomes a negative pulse with a pulse duration equivalent to the phase delay time, and second phase difference detection signal $X_2$ retains a low level state. If the phase of oscillation output $V_{OUT}$ is advanced ahead of the phase of input signal $S_{IN}$, however, second phase difference detection signal $X_2$ becomes a positive pulse with a pulse duration equivalent to the phase advance time and first phase difference detection signal $X_1$ retains a high level state.

First charge pump 70 comprises a switching transistor (p-type MOSFET) $Tr_1$ for output which changes to an ON state when first phase difference detection signal $X_1$ is low, a current source transistor (p-type MOSFET) $Tr_2$ for output disposed between switching transistor $Tr_1$ and power source voltage $V_{DD}$, a switching transistor (n-type MOSFET), $Tr_3$ used for pull-in, which turns ON when second phase difference detection signal $X_2$ is high, and a current source transistor (n-type MOSFET) Tr4, used for pull-in, which is disposed between switching transistor Tr3 and power source voltage $V_{SS}$. Variable-current control circuit 95 comprises a load transistor (p-type MOSFET) Tr5 with a control transistor Tr6 connected to it in series, where the value of a through current $i_0$ which flows to transistors Tr5 and Tr6 changes according to the value of gate voltage for transistor Tr6. Current source transistors Tr2, Tr4 of charge pump 70 also form a MOS current mirror circuit together with transistors Tr5, Tr6 of variable-current control circuit 95. When the sizes of the transistors of the current mirror circuit are the same, the values for through current $i_0$ and output current $i_1$ of charge pump 70 are equal to each other. As a result, one of the different bias voltages $b_1$ and $b_2$ is made the gate voltage of transistor Tr6 by switching the state of switch SW2 and the value of output current $i_1$ is variable.

Second charge pump 80 also comprises a switching transistor (p-type MOSFET) Tr7 for output which turns ON when first phase difference detection signal $X_1$ is low, a current source transistor (p-type MOSFET) Tr8 for output disposed between switching transistor Tr7 and power source voltage $V_{DD}$, a switching transistor (n-type MOSFET) Tr9, used for pull-in, which turns ON when second phase difference detection signal $X_2$ is high, and a current source transistor (n-type MOSFET) Tr10, used for pull-in, disposed between switching transistor Tr9 and power source voltage $V_{SS}$. Current source transistors Tr8, Tr10 of charge pump 80 form a MOS current mirror circuit together with transistors Tr5, Tr6 of variable-current control circuit 95. When the transistors in the current mirror circuit are of the same size, the values of through current $i_0$ and drive current $i_2$ of charge pump 80 are equal to each other. Therefore, the value of output current $i_2$ is varied by switching switch SW2.

Figure 3:
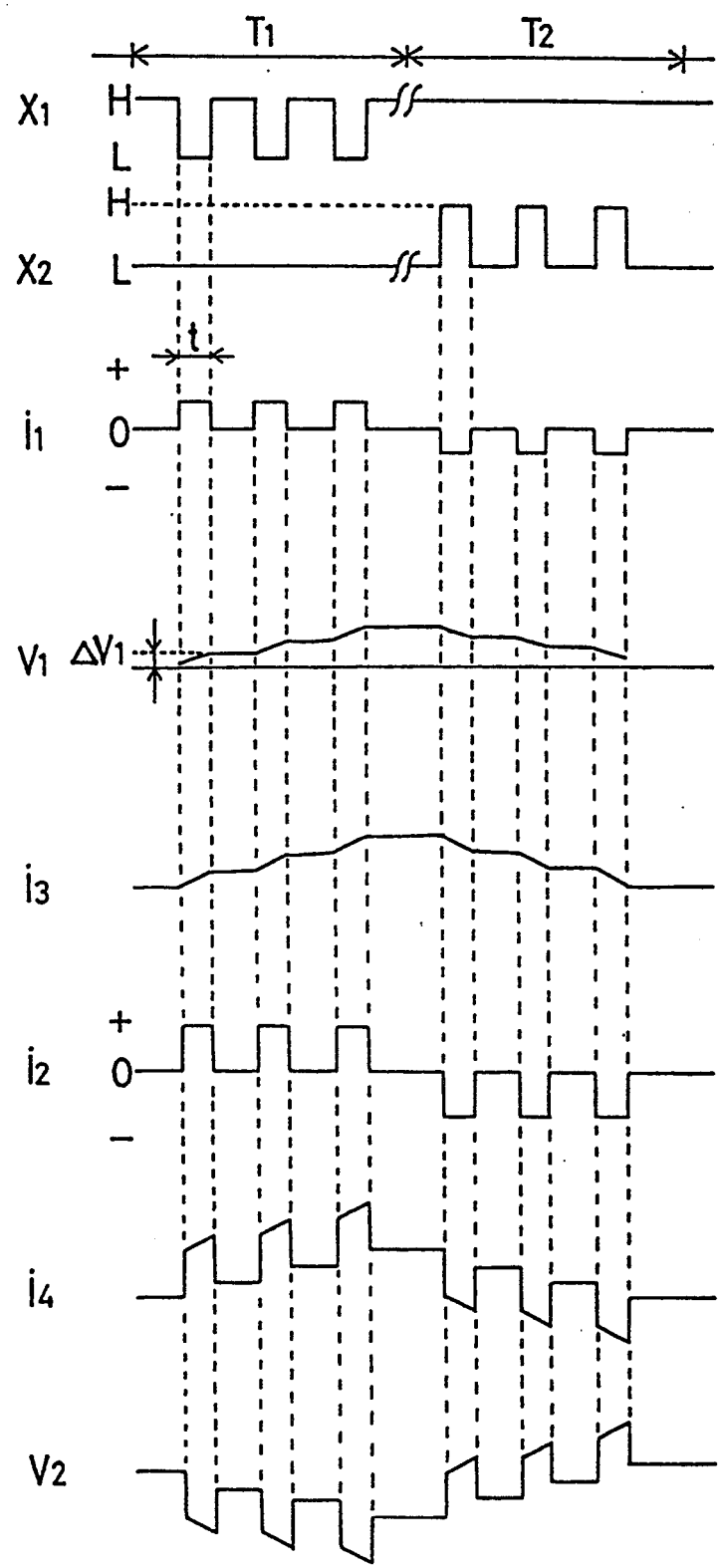
FIG. 3 is a timing chart showing waveforms for each signal in the embodiment of FIG. 1.

When input signal $S_{IN}$ enters phase-locked loop 100 at a first data transfer rate, frequency $f_1$, switch SW1 is connected to resistor $R_1$ and switch SW2 is connected to bias $b_1$ by zone switching signal Z to correspond with a first data transfer rate. As shown in FIG. 3, during the delayed phase period in which the phase of oscillation output $V_{OUT}$ is delayed in comparison to the phase of input signal $S_{IN}$, first phase difference detection signal $X_1$ becomes a negative pulse whose pulse duration is the phase delay time and second phase difference detection signal $X_2$ remains low. Therefore, charge pump 70 generates output current $i_1$ with a rectangular pulse as shown in FIG. 3. Since capacitor $C_1$ is charged and capacitor $C_2$ is discharged by output current $i_1$, voltage $V_1$ at series connection point (filter output) $P_1$ increases gradually during the phase delay portion of each period as shown in FIG. 3. Here, assuming the phase delay time of each period is $t$ and the total capacitance of filter capacitors $C_1$, $C_2$ is $C$ ($=C_1+C_2$), the change in voltage $\Delta V_1$ for voltage $V_1$ at output point $P_1$ of the filter is given by:

$$\Delta V_1 = \frac{(i_1 \cdot t)}{C} \qquad (3)$$

Therefore, voltage $V_1$ increases in potential gradually during the delayed phase portion of each period and remains fixed in the remaining portion of each period. The voltage at the output terminal of buffer circuit 91 is the same value as input voltage $V_1$, and the voltage at addition point $P_2$ is $V_{DD}/2$ since it forms an imaginary short with the noninverted input of operational amplifier 92. Therefore, current $i_3$ which flows to resistor $R_1$ is given by:

$$i_3 = \frac{(V_1 - V_{DD}/2)}{R_1} \qquad (4)$$

As also shown in FIG. 3, the value of current $i_3$ increases gradually during the delayed phase portion of each period and does not change in the remaining portion of each period.

During phase delay period $T_1$, charge pump 80 generates a rectangular pulse output current $i_2$ signal as shown in FIG. 3. As a result, current $i_4$, which flows from addition point $P_2$ to the output terminal side of operational amplifier 92 through return resistor $R_3$, is the sum of current $i_2$ and current $i_3$, and is given by:

$$i_4 = i_2 + i_3 = i_2 + \frac{(V_1 - V_{DD}/2)}{R_1} \qquad (5)$$

Therefore, composite current $i_4$ during phase delay period $T_1$ increases gradually during each time $t$, as shown in FIG. 3. This causes the amount of voltage drop due to return resistor $R_3$ to gradually increase as the period of phase delay advances over period $T_1$. Therefore, input voltage $V_2$ of voltage-controlled oscillator 50 is given by:

$$V_2 = V_{DD}/2 - i_4 \cdot R_3 \qquad (6)$$

As can be seen in FIG. 3, input voltage $V_2$ gradually decreases during phase delay period $T_1$. Since voltage-controlled oscillator 50, of this embodiment, is configured as a proportional oscillator 50 which outputs a signal of frequency $f_{OSC}$, which is proportional to input voltage $V_2$, which voltage is also feedback to the negative input of operational amplifier 92. oscillation frequency $f_{OSC}$ increases as the value of input voltage $V_2$ decreases. Therefore, as phase delay period $T_1$ advances, oscillation frequency $f_{OSC}$ gradually increases and the phase delay difference decreases until, ultimately, the phases are synchronized. During this lock-in process, the delayed phase difference of each period becomes gradually smaller, but for convenience sake, phase differences $t$ within each period are displayed as the same in FIG. 3.

In contrast, in advanced phase period $T_2$, in which the phase of oscillation output $V_{OUT}$ is advanced in comparison to the phase of input signal $S_{IN}$, second phase difference detection signal $X_2$ becomes a positive pulse whose pulse duration is the phase advance time, and first phase difference detection signal $X_1$ remains high. Therefore, charge pump 70 pulls in rectangular pulse discharge current $i_1$ from filter 75, as shown in FIG. 3. In FIG. 3, the polarity of current $i_1$ is negative. Since capacitor $C_2$ is charged when capacitor $C_1$ is discharged by pull-in current $i_1$, the voltage at series connection point $P_1$ decreases in steps at each phase advance time during each period as shown in FIG. 3. The voltage change $\Delta V_1$ of voltage $V_1$ is given by equation (3) above. Therefore, the potential of voltage $V_1$ drops gradually during the advanced phase portion of each period, and remains fixed during the remaining portion of each period. Current $i_3$, which flows to resistor $R_1$, is given by equation (3), but it decreases gradually during the delayed phase portion of each period of delayed phase period $T_2$ and remains unchanged in the remaining portion of each period. When voltage $V_1$ is less than $V_{DD}/2$, current $i_3$ flows from operational amplifier 92 to buffer circuit 91.

During phase advance period $T_2$, charge pump 80 generates rectangular pulse pull-in current $i_2$, as shown in FIG. 3. As a result, current $i_4$, which flows to return resistor $R_3$, is given by equation (5). Input voltage $V_2$ of voltage-controlled oscillator 50 is given by equation (6). Therefore, as can be seen from FIG. 3, input voltage $V_2$ of voltage-controlled oscillator 50 gradually increases during phase advance period $T_2$. This causes oscillation frequency $f_{OSC}$ to gradually decrease as the time within phase advance period $T_2$ advances and the advance phase difference to decrease, and the phases ultimately to become synchronized. In this manner, when input signal $S_{IN}$ is at the first data transfer rate (frequency $f_1$), the phase of oscillation frequency $f_{OSC}$ synchronizes with the phase of input signal $S_{IN}$.

In the above embodiment, filter 75, made from capacitors $C_1$ and $C_2$, corresponds to capacitor $C_F$ (see FIG. 4) of filter 30 in the former phase-locked loop, and the DC output voltage $V_1$ (holding voltage) becomes a frequency control signal that controls the frequency of voltage-controlled oscillator 50. The voltage drop of resistor $R_3$ due to output current $i_2$ of charge pump 80 is equivalent to the voltage drop of resistor $R_F$ of filter 30 in the former phase-locked loop, and, therefore, it becomes a phase control pulse signal with an equivalent phase error time and phase error polarity. As described above, the waveform of input voltage $V_2$ of voltage-controlled oscillator 50, in this embodiment, is essentially the same as in the prior art. In this embodiment, operational amplifier 92 is connected in the stage following addition point $P_2$ and after it converts the composite current to a voltage. It uses the converted voltage as control input voltage $V_2$ of voltage-controlled oscillator 50, but it is possible to directly connect only the current-frequency conversion circuit of the voltage-controlled oscillator in the stage after addition point $P_2$.

The equations, equations (1) and (2), that express the basic characteristics of the prior art phase-locked loop (see FIG. 4) and the relationship of this embodiment to the prior art phase-locked loop are explained below. Where the voltage-frequency conversion factor of voltage-controlled oscillator 50 in this embodiment is $K_{V0}$ and the voltage-frequency conversion factor when the output of voltage-controlled oscillator 50, as seen from output terminal $P_1$ of filter 75, is $K_V (=f_{OSC}/V_1)$, factor $K_V$ is expressed as:

$$K_v = \left(\frac{R_3}{R_1}\right) K_{v0} \quad (7)$$

from voltage amplification by operational amplifier 92.

Also, conversion factor $K_c$ of the phase comparator including charge pump 70 is given by the following equation expressed in radians.

$$K_c = \frac{i_1}{2p} \quad (8)$$

Furthermore, capacitance C in equation (2) is equal to the sum 2C of total capacitance for capacitors $C_1$ and $C_2$. Therefore, equations (1) and (2) can be rewritten as follows:

$$\omega_n = \sqrt{R_3 \cdot i_1 \cdot \frac{K_{v0}}{4pCR_1}} \quad (9)$$

Figure 4:
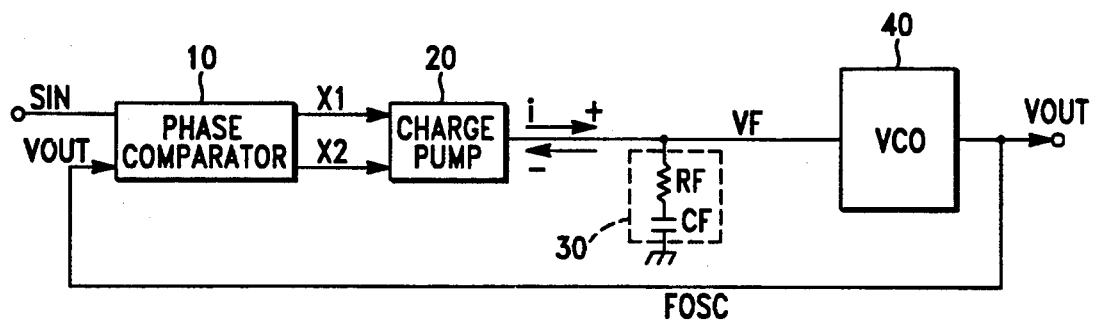
FIG. 4 is a block diagram of an exemplary prior art phase-locked loop.
Figure 5:
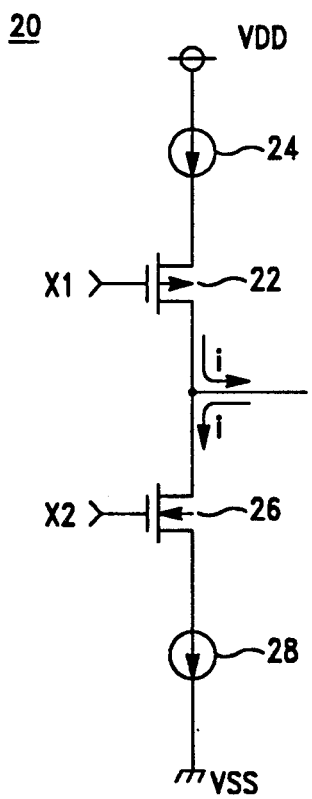
FIG. 5 is a circuit diagram of a charge pump used in the prior art example of FIG. 4.
Figure 6:
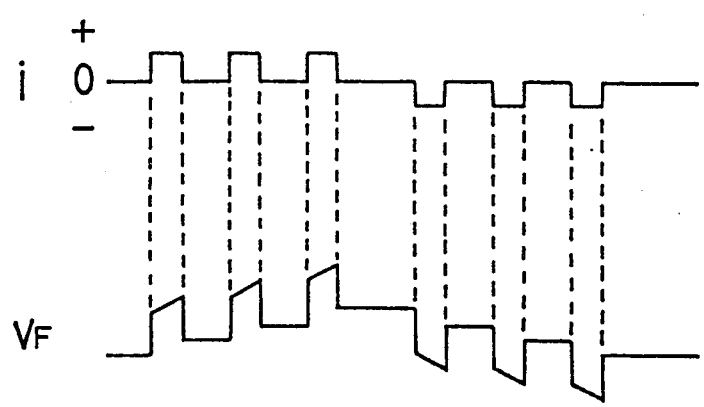
FIG. 6 is a timing chart for waveforms of an output current from the charge pump and an output voltage of the loop filter in the prior art example of FIG. 4.

When the output current of charge pump 20 in the prior art phase-locked loop shown in FIG. 4 is $i_1$, the stepped voltage drop of resistor $R_F$ in filter 30 is given by $i_1 \cdot R$. Since this voltage drop can be achieved in this embodiment by injecting current $i_2$ from charge pump 80, current $i_2$ can theoretically be considered as flowing to resistor $R_1$ in addition to current $i_3$. Therefore, the following equation is valid.

$$i_1 \cdot R = i_2 \cdot R_1 \quad (10)$$

When resistance R is sought from this equation, then:

$$R = \frac{(i_2 R_1)}{i_1} \quad (11)$$

Therefore, equation (2) can be rewritten as follows.

$$z = \frac{C i_2 R_1 \omega_n}{i_1} \quad (12)$$

Next, when the zone of the hard disk, etc., changes and input signals $S_{IN}$ changes to the second data transfer rate (frequency $f_2$), which is faster than the first data transfer rate (frequency $f_1$), switch $SW_1$ is connected to resistor $R_2$ and switch $SW_2$ is connected to bias $b_2$, by the generation of zone switching signal Z so as to correspond to the second data transfer rate. Where frequency $f_2$ is double frequency $f_1$, the value of resistor $R_2$ is half that of resistor $R_1$ ($2R_2=R_1$), and the value of through current $i_0$ which flows to transistor $Tr_6$ of variable-voltage control circuit 95, with the voltage bias $b_2$ as the gate voltage, is twice that of when the voltage bias $b_1$ is the gate voltage. The value of damping factor z is the same as in the case of the first transfer rate, while the value of the natural angular frequency $w_n$ is twice that of the first transfer rate case and phase locking can be achieved.

That is, where the damping factor, natural angular frequency, output current of charge pump 70, and output current of charge pump 80 are $z'$, $w_n'$, $i_1'$ and $i_2'$, respectively, the values of $i_1'$ and $i_2'$ both double when the value of the through current $i_0$ doubles. Therefore, natural angular frequency $w_n'$ and damping factor $z'$ are given by the following equations.

$$\omega_n' = \sqrt{R_3 \cdot i_1' \cdot \frac{K_{v0}}{4pCR_2}} \quad (13)$$
$$= \sqrt{4R_3 \cdot i_1 \cdot \frac{K_{v0}}{4pCR_1}}$$

$$z' = Ci_2' R_2 \omega_n'/i_1' = Ci_2 R_1 \omega_n/i_1 = z \quad (14)$$

By switching switches $SW_1$ and $SW_2$ using zone switching signal Z, when the data transfer rate changes by means of this embodiment in this manner, the natural angular frequency can be made proportional to the data transfer rate with the damping factor left unchanged, thus realizing an optimal phase-locking characteristic. Since the output current $i_1$ used has a small current carrying capacity, the capacitance of capacitors $C_1$, $C_2$, which make up the loop filter, can be small and the capacitors can be built into an IC chip. They also do not require a high precision capacitance. However, since resistors $R_1$, $R_2$ used for voltage-current conversion require a relatively precise resistance value, they should be external to the IC chip. Even when resistors $R_1$, $R_2$ are external components, rectangular pulse current component (current $i_2$) which contains a considerable high frequency component, does not flow and current $i_2$ is processed inside the IC chip. The current flowing to resistors $R_1$, $R_2$ is current $i_3$, which is a DC and low frequency component. Therefore, even if the parasitic capacitance caused by external resistors $R_1$, $R_2$ does unavoidably exist, any high frequency component is not affected by the parasitic capacitance and ultimately the parasitic capacitance can be ignored and the phase-locking characteristic is improved by the improved resolution. Of course, since output current $i_1$ is not directly affected by parasitic capacitance, its value does not need to be increased and an increase in current carrying capacity using a larger transistor is not necessary. As a result, waveform distortion can be suppressed by the reduced feed through effect, and the phase-locking characteristic within a high frequency range can be improved in this regard as well. Also, even if external resistors $R_1$ and $R_2$ increase any wiring length, there is no flow of a high frequency component, and, therefore, there is no wiring inductance, and stable frequency oscillation can be achieved.

What is claimed is:

1. A phase-locked loop that detects the phase difference between an input signal, which is a reference signal, and an oscillator output, and controls an oscillation frequency and phase of said oscillator output so that the phase difference becomes zero, wherein said phase-locked loop comprises:
   a phase comparator means for comprising the phase of said input signal and said oscillator output, and outputting a phase error signal corresponding to a phase difference;
   a frequency control means for receiving said phase error signal as an input and converting it to a DC component and generating a frequency control current; and
   a phase control means for receiving said phase error signal as an input and generating a phase control current pulse with an equivalent phase error time and phase error polarity, and comprises an oscillation means for generating an oscillating output signal whose oscillation is controlled by the sum of said frequency control current and said phase control current pulse.

2. The phase-locked loop of claim 1 wherein said frequency control means comprises a first charge pump means for generating an output current with a value corresponding to the frequency of said input signal, and a polarity corresponding to said phase error polarity, a filter means comprising at least one capacitor for using that output current as a charge/discharge current, a voltage buffer means for extracting the output voltage of the filter, and a voltage-current conversion means for converting the output voltage of the voltage buffer means to said frequency control current.

3. The phase-locked loop of claim 2 wherein said voltage-current conversion means comprises a resistor.

4. The phase-locked loop of claim 3 wherein said resistor is configured to select differing resistance values according to the value of the frequency of the input signal and comprises plural resistors external to an integrated circuit chip.

5. The phase-locked loop of claim 2 wherein the first charge pump means comprises a variable current source for current discharge and variable current source for current pull-in which change their current values according to the value of the frequency of said input signal.

6. The phase-locked loop of claim 1 wherein said phase control means comprises a second charge pump which generates said phase control current pulse with a value corresponding to the frequency of said input signal and polarity corresponding to said phase error polarity.

7. The phase-locked loop of claim 6 wherein said second charge pump has a variable current source for current discharge and variable current source for current pull-in which each change their respective current magnitudes according to the frequency of said input signal.

8. The phase-locked loop of claim 2 wherein said filter means comprises a plurality of capacitors connected in series between power source voltages.

9. The phase-locked loop of claim 3 wherein the first charge pump means comprises a variable current source for current discharge and variable current source for current pull-in which change their current values according to the value of the frequency of said input signal.

10. The phase-locked loop of claim 4 wherein the first charge pump means comprises a variable current source for current discharge and variable current source for current pull-in which change their current values according to the value of the frequency of said input signal.

11. The phase-locked loop of claim 2 wherein said phase control means comprises a second charge pump which generates said phase control current pulse with a value corresponding to the frequency of said input signal and polarity corresponding to said phase error polarity.

12. The phase-locked loop of claim 3 wherein said phase control means comprises a second charge pump which generates said phase control current pulse with a value corresponding to the frequency of said input signal and polarity corresponding to said phase error polarity.

13. The phase-locked loop of claim 4 wherein said phase control means comprises a second charge pump which generates said phase control current pulse with a value corresponding to the frequency of said input signal and polarity corresponding to said phase error polarity.

14. The phase-locked loop of claim 5 wherein said phase control means comprises a second charge pump which generates said phase control current pulse with a value corresponding to the frequency of said input signal and polarity corresponding to said phase error polarity.

* * * * *

UNITED STATES PATENT AND TRADEMARK OFFICE
CERTIFICATE OF CORRECTION

PATENT NO. : 5,319,320
DATED : June 7, 1994
INVENTOR(S) : Akira Abe, et. al.

It is certified that error appears in the above-indentified patent and that said Letters Patent is hereby corrected as shown below:

Column 11, line 39, change "comprising" to --comparing--.

Signed and Sealed this

Twenty-second Day of November, 1994

Attest:

BRUCE LEHMAN

Attesting Officer

Commissioner of Patents and Trademarks